United States Patent [19]
Nakamura et al.

[11] 4,428,980
[45] Jan. 31, 1984

[54] METHOD FOR FORMING AN INHOMOGENEOUS OPTICAL LAYER

[75] Inventors: Kazuo Nakamura, Tokyo; Hirotsugu Mizorogi, Ebina; Akihiko Isao, Sakura, all of Japan

[73] Assignee: Ulvac Seimaku Kabushiki Kaisha, Kanagawa, Japan

[21] Appl. No.: 491,792

[22] Filed: May 3, 1983

Related U.S. Application Data

[62] Division of Ser. No. 373,145, Apr. 29, 1982.

[30] Foreign Application Priority Data

Jul. 31, 1981 [JP] Japan .................. 56-119150

[51] Int. Cl.³ .................. G02B 1/10; B05D 1/34; B05D 5/06
[52] U.S. Cl. .................. 427/162; 427/164; 427/166; 427/167
[58] Field of Search ............... 427/162, 164, 166, 167

[56] References Cited

U.S. PATENT DOCUMENTS 3,520,716  7/1970  Okamoto et al. .............. 118/720 X Primary Examiner—James R. Hoffman
Attorney, Agent, or Firm—Mason, Fenwick & Lawrence

[57] ABSTRACT

An inhomogeneous optical layer is formed on a surface of a substrate in a vacuum coater, in which the substrate is moved along a travelling path having path sections and two substances are evaporated from their respective sources and both of the substances are deposited on a common surface section of the surface. In such an operation, the deposition rate of each of the substances is varied monotoneously along the path in each of the path section in order that, in a layer formed by the deposition on the substrate, the content of each of the substances is varied monotonously in the direction of thickness. If the refractive index of one of the substances is different from that of the other of the substances, the resultant refractive index in the layer is varied monotoneously in the direction of the thickness of the layer.

2 Claims, 12 Drawing Figures

FIG.I
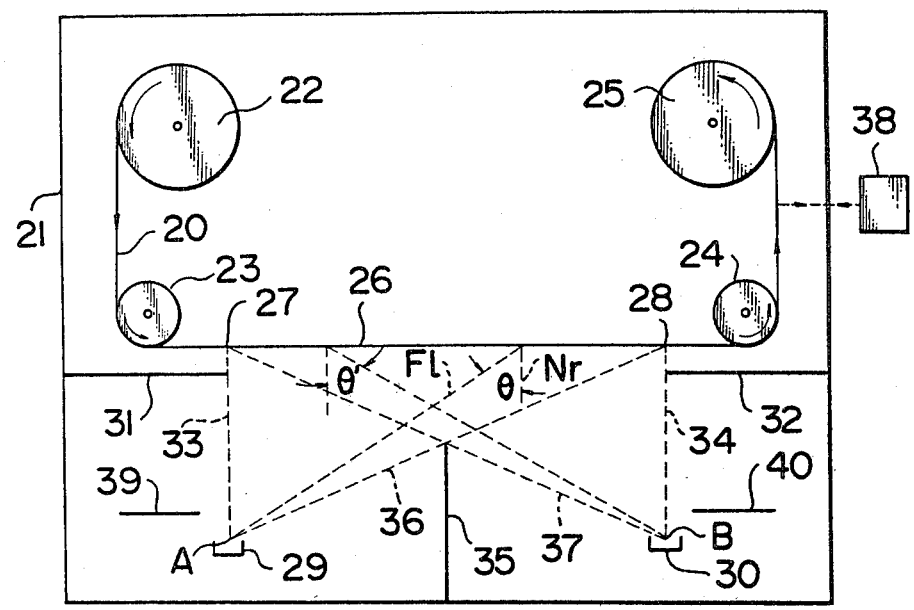
FIG.2
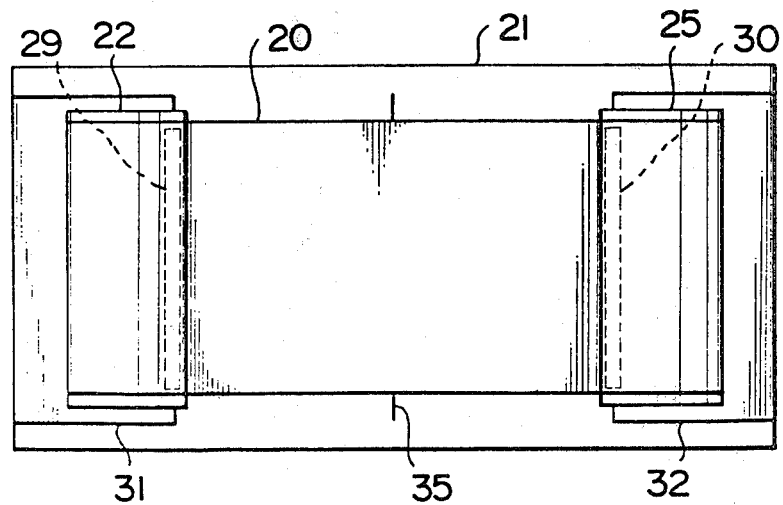

METHOD FOR FORMING AN INHOMOGENEOUS OPTICAL LAYER

CROSS-REFERENCE TO RELATED APPLICATION

This application is a division of application Ser. No. 373,145 filed on Apr. 29, 1982.

BACK GROUND OF THE INVENTION

The present invention relates to a method and an apparatus for forming an inhomogeneous optical layer on a surface of a substrate.

The inhomogeneous optical layer is a layer which is so formed that the optical refractive index varies from its inner surface contacting with the substrate to its outer surface or exposed surface, and a special inhomogeneous optical layer in which the refractive index varies monotonously is used widely as an optical film for preventing reflection of light or as an optical film for absorbing light selectively depending on the wave length of the light.

In a known method for forming such an inhomogeneous optical layer, the substrate is fixed in a vacuum coater vessel including two evaporation sources so that a surface of this substrate faces one evaporation source for high refractive substance as well as the other evaporation source for low refractive substance, and both the sources are energized in order that both the substances are evaporated in the sources, emitted from them and deposited on said one surface. Each of the deposition rate of each of the substances is watched by an appropriate monitor, and the input energy of each of the sources is controlled in order to vary the deposition rate of each of the substances with time according to the program. For example: if the deposition rate of the high refractive substance is decreased monotonously with time and that of the low refractive substance is increased monotonously with time; in the layer made of both the substances deposited on said one surface, the content of the high refractive substance decreases monotonously in the direction of the outer surface of the layer and the content of the low refractive substance increases monotonously in the same direction, and therefore the resultant refractive index in the layer decreases in said direction.

However, the known method has disadvantage that it is impossible to form an inhomogeneous optical layer on a surface of a long, wide or large substance because the substrate has to be fixed in the vacuum vessel, and the operation is troublesome because it is necessary to vary the deposition rate with time.

SUMMARY OF THE INVENTION

Accordingly, an object of the invention is to provide a method and an apparatus for forming an inhomogeneous optical layer in which the layer may be formed on a long, wide or large substrate without varying the deposition rate with time.

In order to achieve said object the invention provides a method for forming an inhomogeneous optical layer on a surface of a substrate, in which, while the substrate is moved along a travelling path having a path section or a number of path sections, two different evaporation substances evaporated from their respective source means is deposited on said surface with the deposition rate of each of these substances being varied monotonously along the travelling path in the path section or each of the path sections.

In this method it is advisable that the incident angle and the flight length of each of the evaporation substances are varied monotonously along the travelling path in the path section or each of the path sections in order that the deposition rate of each of these substances is varied monotonously along the travelling path in the path section or each of the path sections.

The invention provides, moreover, an apparatus for forming an inhomogeneous optical layer on a surface of a substrate comprising a vacuum vessel, means for moving the substrate along a travelling path in the vacuum vessel, said travelling path having a path section or a number of path sections, two different source means for evaporating their respective different evaporation substances in the vacuum vessel, deposition rate regulating means for causing each of the evaporation substances evaporated from their respective source means to be deposited on the surface of the substrate moving along the travelling path with the deposition rate of each of the substances being varied monotonously along the travelling path in the path section or each of the path sections.

It is preferable that the deposition rate regulating means is constructed by shader means which shades the evaporation substances evaporated from their respective source means and flying in the vacuum vessel so that the incident angle and the flight length of each of the evaporation substances are varied monotonously along the travelling path in the path section or each of the path sections.

BRIEF DESCRIPTION OF THE DRAWINGS

The preferred embodiments of the invention will be now described in great detail with reference to the accompanying drawings wherein:

FIG. 1 is a diagrammatic side view of the first embodiment of the vacuum coater adapted to the method and apparatus according to the invention;

FIG. 2 is a diagrammatic plan showing the coater of FIG. 1;

DETAILED DESCRIPTION OF THE PREFERRED EMBODIMENTS

Figure 3:
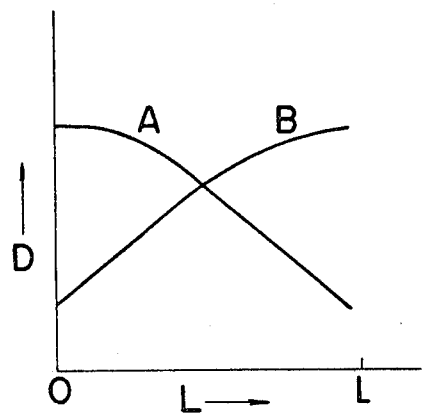
FIG. 3 is a graph showing the relation between the travelling distance and the depositing rate in the coater of FIG. 1.

Referring to FIGS. 1 and 2 of the drawings these figures show a vacuum evaporation apparatus or vacuum coater including a vacuum evaporation vessel 21, in which a long film-shaped substrate 20 is unwound from a substrate roll 22 arranged in a left upper position and deflected by a first deflector roller 23, and then travels along its horizontal travelling path 26. Thereafter the substrate 20 is deflected by a second deflection roller 24 and wound into a product roll 25 arranged in a right upper position. An evaporation source 29 of evaporation substance A is positioned at an appropriate distance directly blow a point 27 near the left end of the horizontal travelling path 26 of the substrate 20. Similarly, another evaporation source 30 of another evaporation substance B is positioned at an appropriate distance directly blow a point 28 near the right end of the horizontal travelling path 26 of the substrate 20. A first shader plate 31 is an arranged under and near the horizontal travelling path 26 that the first plate 31 prevents the evaporation substance A flying from the evaporation source 29 from reaching the substrate 20 on the left side of a vertical limit 33 passing through the point 27 and evaporation source 29. Similarly, a second shader plate 32 is so arranged under and near the horizontal travelling path 26 that the second plate 32 prevents the evaporation substance B from reaching the substrate 20 on the right side of a vertical limit 34 passing through the point 28 and evaporation source 30. A vertical shader plate 35 positioned between the sources 29 and 30 is so arranged that this vertical plate 35 prevents the evaporation substance A from reaching the substrate 20 on the right side of a oblique limit 36 passing through the point 28 and the source 29 and also prevents the evaporation substance B from reaching the substrate 20 on the left side of a oblique limit 37 passing through the point 27 and the source 29.

Figure 4:
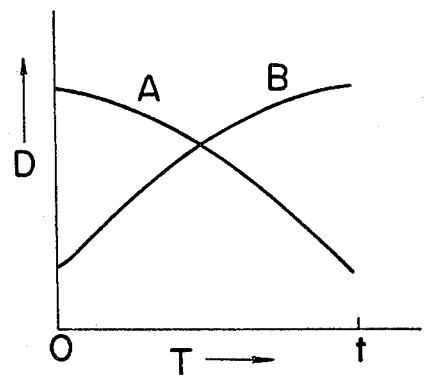
FIG. 4 is a graph showing the relation between the depositing time and the depositing rate in the coater of FIG. 1.

According to such an arrangement, both the evaporation substances A and B arrive onto the under-surface of the substrate 20 in a path section between the points 27 and 28. In this case, it may be clear that the depositing rate D (see FIGS. 3 and 4) of the evaporation substance on each surface section of the film-shaped substrate 20 decreases monotonously as to the substance A and increases monotonously as to the substance B when this surface section travels from the position 27 to the position 28, because the incident angle $\theta$ of the evaporation substance A on the surface section (that is, the angle between the normal Nr of the substrate surface and the flight direction Fl of the evaporation substance A at said surface section) and the flight length $Fl(\theta)$ (that is, the distance between the evaporation source andd the surface section) increase monotonously from 0° and $Fl(0)$ in the position 27 to the values in the position 28 respectively and similarly the incident angle $\theta°$ and the flight length $Fl(\theta°)$ of the evaporation substance B decrease monotonously from the values in the position 27 to 0° and $Fl(0)$ in the position 28 respectively. Such variations of depositing rate D is shown in FIG. 3 in which the ordinate indicates the depositing rate D and the abscissa the travelling distance L which is assumed to be zero in the position 27 and l in the position 28. Accordingly, as shown in FIG. 4, the deposition rate D of the substance A decreases monotonously and the deposition rate of the substance B increases monotonously in regard to the depositing time T which is assumed to be zero at the time when the surface section is positioned in the deposition start position 27 and t at the time when the surface section is positioned in the deposition finish position 28.

Figure 5:
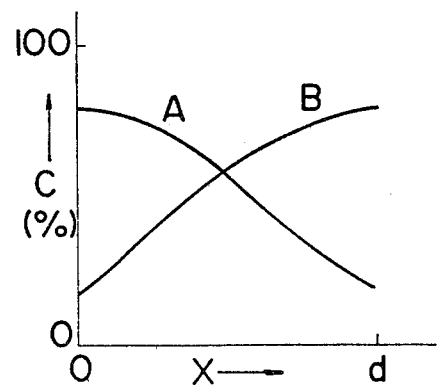
FIG. 5 is a graph showing the distribution of content in the layer obtained in the coater of FIG. 1.
Figure 6:
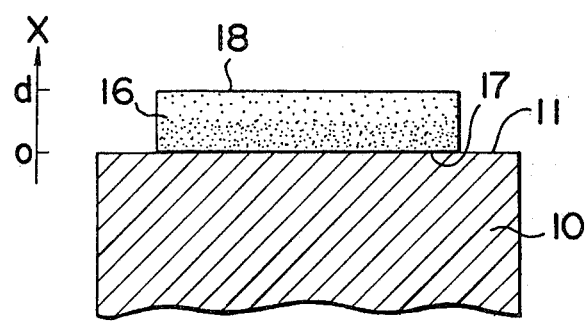
FIG. 6 is an enlarged sectional view of an inhomogeneous optical layer on a substrate.

Accordingly, as shown in FIGS. 5 and 6, the content C of the evaporation substance A decreases monotonously while the content C of the evaporation substance B increases monotonously in a coating layer 16 formed or produced on each surface section 11 of the substrate 20 from a value at the bottom or inner surface 17 (x=0) of the layer 16 contacting with the surface of the substrate 20 to a value at the top or outer surface 18 of the layer 16 not facing the substrate. (It is clear that x=0 corresponds to L=0 i.e. the position 27 and x=d corresponds L=d i.e. the position 28.)

Accordingly, if the evaporation substance A has a high refractive index and the evaporation substance B has a low refractive index then a coating layer 16 with refractive index decreasing monotonougly from the bottom 17 to the top 18, and vice versa.

In FIGS. 1 and 2, a reference numeral 38 indicates a light emitter/receiver of an optical monitor, and 39 and 40 indicate movable shutters for the evaporation sources 29 and 30.

Figure 7:
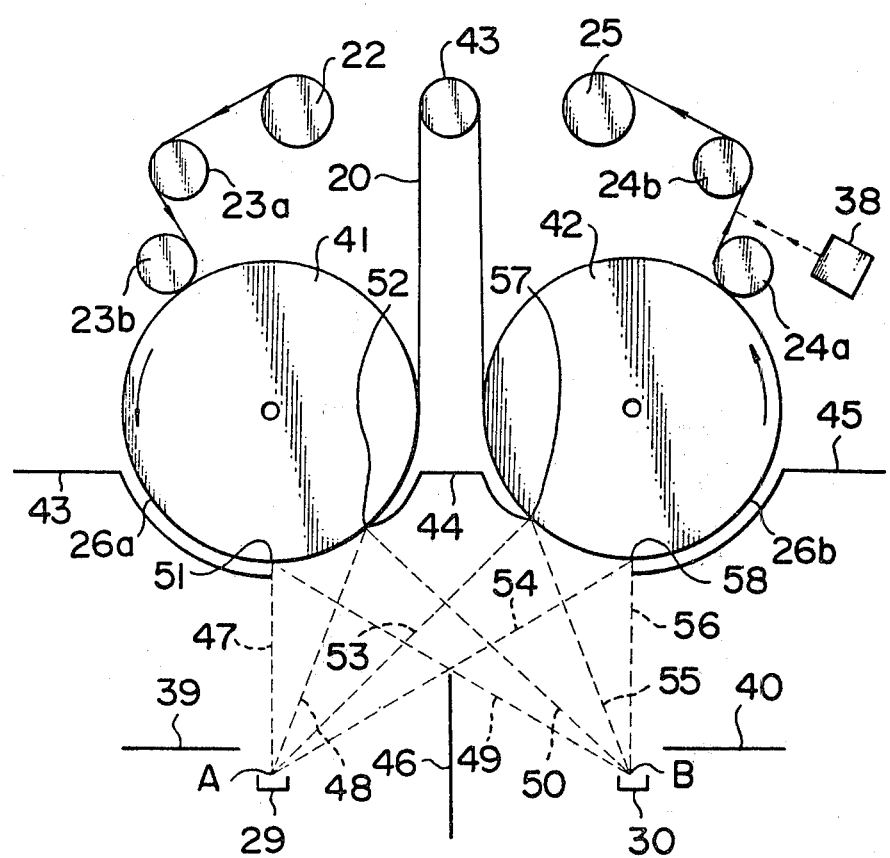
FIG. 7 shows the second embodiment of the coater.

A vacuum coater or vacuum evaporation apparatus illustrated in FIG. 7 has a vacuum evaporation vessel (not shown) in which two parallel cooling drums 41 and 42 are arranged side by side. A film-shaped substrate 20 is unwound from a substrate roll 22 and deflected by several deflector rollers 23a and 23b, and travels along a first arc-shaped travelling path portion 26a while contacting with the lower side of the first cooling drum 41. Thereafter, the substrate 20 is deflected by a deflector roller 43 and travels along a second arc-shaped travelling path portion 26b while contacting with the lower side of the second cooling drum 42. Then the substrate 20 is deflected by several deflector rollers 24a and 24b and wound into a product roll 25. An evaporation source 29 of evaporation substance A is so arranged directly below the horizontal axis of the first cooling drum 41 that this source is remote from the drum 42, and another evaporation source 30 of evaporation substance B is so arranged directly below the horizontal axis of the second cooling drum 42 that this source is remote from the drum 41. By means of four shader plates 43, 44, 45 and 46, both the first evaporation substance A emitted from the evaporation source 29 and flying between a limit 47 and a limit 48 and the second evaporation substance B emitted from the evaporation source 30 and flying between a limit 49 and a limit 50 are deposited on the lower surface of the substrate 20 in a path section (51, 52) of the first arc-shaped travelling path portion 26a between positions 51 and 52, and similarly both the first substance A emitted from the source 29 and flying between a limit 53 and a limit 54 and the second substance B emitted from the source 30 and flying between a limit 55 and a limit 56 are deposited on the lower surface of the substrate 20 in a path section (57, 58) of the second arc-shaped travelling path portion 26b between positions 57 and 58. Each of the limits 47 and 50 is a plane being perpendicular to the surface of the first cooling drum 41, and each of the limits 53 and 56 is a plane being perpendicular to the surface of the second cooling drum 42. Moreover, these limits are so selected that the depositing rate in the position 57 is equal to that in the position 52 as to both the evaporation substances A and B. According to this arrangement, the depositing rate of the substance A decreases monotonously in the path section (51, 52) of the first arc-shaped travelling path portion 26a from a value in the position 51 to that in the position 52 and then in the path section (57, 58) of second arc-shaped travelling path 26b from a value in the position 57 (this value is equal to that in the position 52) to that in the position 58. Similarly, the depositing rate of the evaporation substance B increases monotonously in the path section (51, 52) of the first arc-shaped travelling path portion 26a from a value in the position 51 to that in the position 52 and then in the path section (57, 58) of second arc-shaped travelling path 26b from a value in the position 57 (this value is equal to that in the position 52) to that in the position 58. Thus, the same effect as the coater shown in FIGS. 1 and 2 is obtained by the coater illustrated in FIG. 7.

Figure 8:
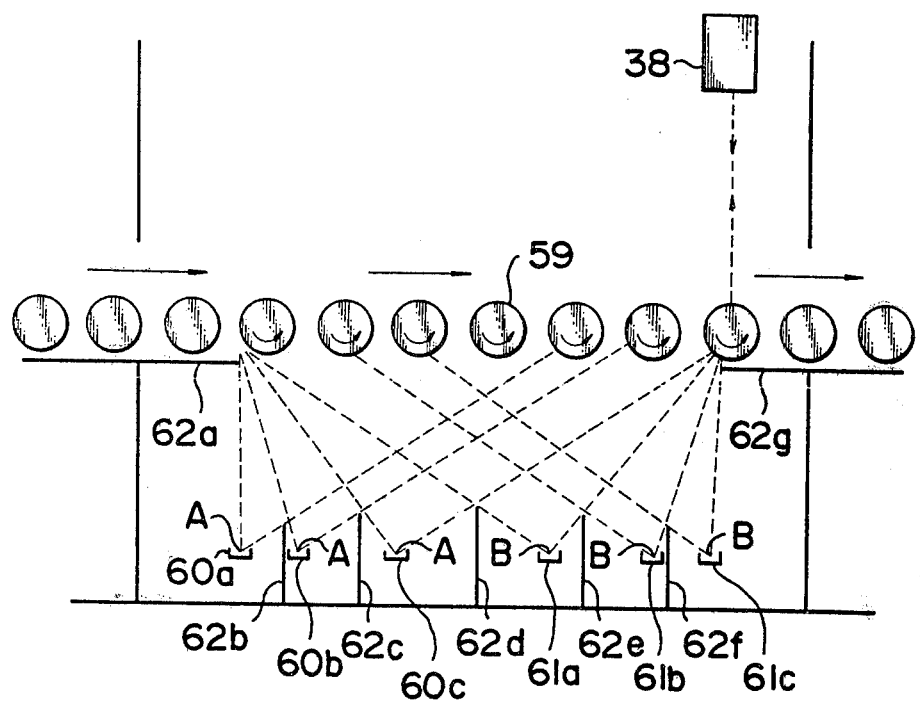
FIG. 8 shows the third embodiment of the coater.

In a vacuum coater as illustrated in FIG. 8, each of cylinder-shaped substrates 59 is moved linearly from the left to the right along a horizontal travelling path while rotating about its own axis. A number of evaporation sources 60a, 60b and 60c of evaporation substance A and a number of evaporation sources 61a, 61b and 61c of other evaporation substance B are arranged at a same height below the travelling path so that the distance between two sources of sources 60a, 60b and 60c increases from the left to the right and the distance between two sources of sources 61a, 61b and 61c decreases from the left to the right. A number of shader plates 62a, 62b, 62c, 62d, 62e, 62f and 62g limit the flight direction of the evaporation substances A and B emitted from each of evaporation sources. It is clear that the deposition rate of the first evaporation substance A decreases and that of the second evaporation substance B increases monotonously along the travelling path in the direction of travel based upon the above arrangement of the evaporation sources.

Although not illustrated, the depositing rate of the first evaporation substance A may be decreased gradually even when the evaporation sources 60a, 60b and 60c are arranged equidistantly and the input power of each of them are decreased gradually from the left to the right, and similarly the depositing rate of the second evaporation substance B may be increased gradually even when the evaporation sources 61a, 61b and 61c are arranged equidistantly and the input power of each of them are increased gradually from the left to the right in the same vacuum coater as in FIG. 8.

Figure 9:
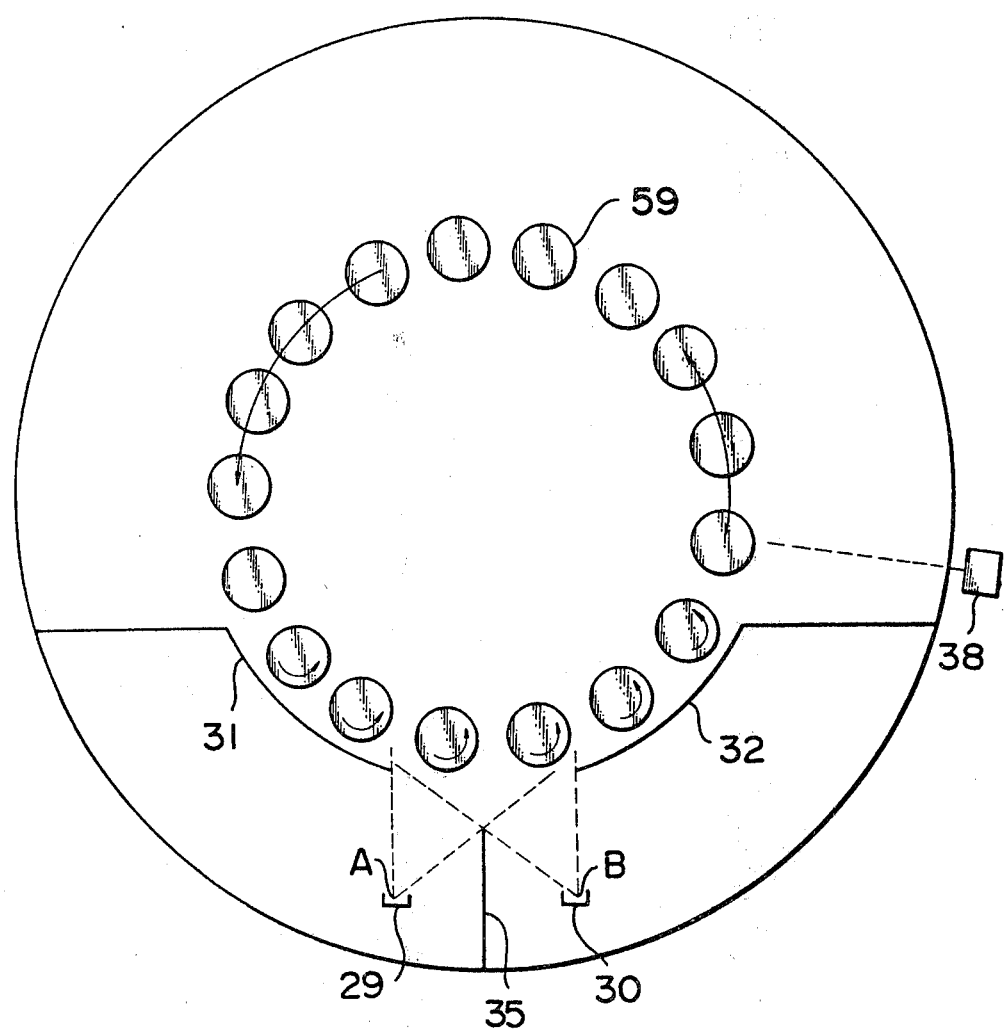
FIG. 9 shows the fourth embodiment of the coater.

In an apparatus of FIG. 9, each of cylinder-shaped substrates 59 is moved along a circular travelling path while rotating about its own axis. Evaporation sources 29 and 30 and shader plates 31, 32 and 35 are arranged as shown in FIG. 1.

According to the invention, an inhomogeneous layer may be formed on a surface of a long, wide or large substrate easily on a large scale by means of simple means such as shader plates without changing the deposition rate with time, as clarified in the above explanation described in connection with various vacuum evaporation apparatuses or vacuum coaters.

The substrate may be shaped as film, foil, plate, cylinder or the like, and may be made of aluminium, copper, stainless steel, nickel, aluminium coated with nickel, glass, semiconductor, plastics and so on. The combination of the first evaporation substance A and the second evaporation substance B is, for example, as follows:

| A—B |
|---|
| (1) $Cr-Cr_2O_3$ |
| (2) $(Cr-Cr_2O_3)-Al_2O_3$ |
| (3) $NiS-ZnS$ |
| (4) $Ni-Al_2O_3$ |
| (5) $Pt-Al_2O_3$ |
| (6) $MgO-Au$ |
| (7) $TiO_2-SiO_2$ |
| (8) $MgF_2-ZrO_2$ |
| (9) $MgF_2-Ge$ |

In the occasion that said $(Cr-Cr_2O_3)-Al_2O_3$ is selected as the combination of the substances A and B, the layer composed of $Cr-Cr_2O_3$ and $Al_2O_3$ on the substrate may be formed by the method wherein substance Cr and substance Al are evaporated in respective evaporation sources and $O_2$ gas is supplied onto the substrate surface in order to cause this $O_2$ gas to react on Cr and Al deposited on the substrate surface. Similarly, the layer containing $SiO_2$, $TiO_2$ and $Al_2O_3$ may be found by oxidation of a layer containing SiO, TiO or Al through the supply of $O_2$ gas.

Figure 10:
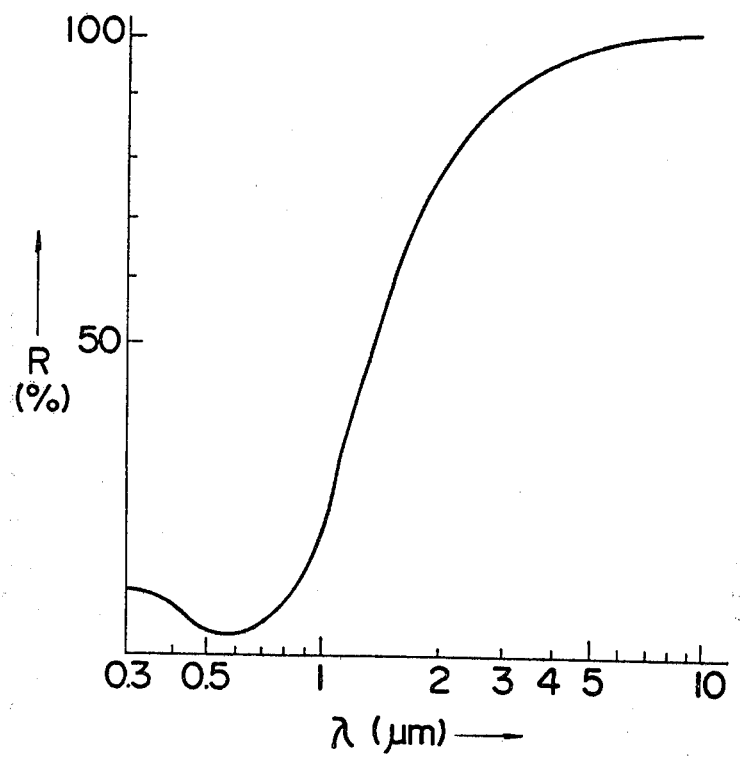
FIG. 10 shows the reflectivity of a layer obtained by an example of the method according to the invention.
Figure 11:
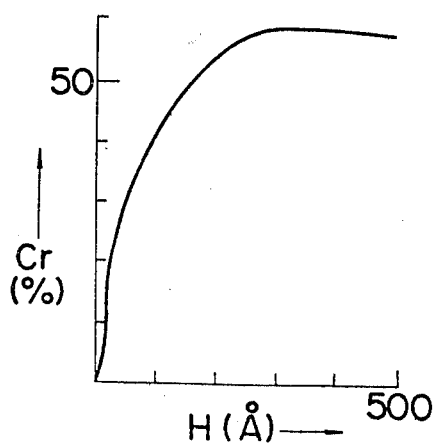
FIG. 11 shows the distribution of content in the layer obtained by the example.
Figure 12:
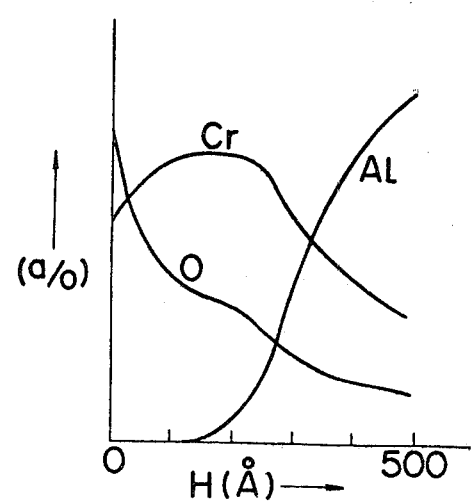
FIG. 12 shows the result of the AES of the layer obtained by the example.

In an example of the method according to the invention explained below, the vacuum coater as shown in FIG. 7 was utilized. The pressure in the vacuum evaporation vessel was $4 \times 10^{-5}$ Torr, and Cr and $Cr_2O_3$ were used as the first and second evaporation substances A and B respectively. An aluminium foil substrate 20 having a thickness of 50 μm, a breadth of 75 mm and a length of 150 m was caused to travel at a speed of 0.4 m/min. to form a selective absorption layer of $Cr-Cr_2O_3$ having a total thickness of 500 Å on a glossy surface (nearly, mirror surface) of the aluminium foil, while watching the reflectivity of the surface of the formed layer by means of the optical monitor 38 in order to control the thickness and the composition of the layer. In this example, the diameters of the first cooling drum 41 and second cooling drum 42 were 40 cm, the distance between the axes of the cooling drums 38 and 39 was 52 cm, the distances between the first evaporation source 29 and the positions 51, 52, 57, 58 were 35 cm, 45 cm, 58 cm, 65 cm respectively, and the distances between the second evaporation source 30 and the positions 51, 52, 57, 58 were 65 cm, 58 cm, 45 cm, 35 cm respectively. Moreover, the incident angles of the first evaporation substance A (the angle between the normal plane of the cooling drum 41 or 42 and the incident direction of the evaporation substance) in the positions 51, 52, 57 and 58 were 0, 60, 0 and 60 degrees respectively, and the incident angles of the second evaporation substance B in these positions were 60, 0, 60 and 0 degrees respectively. The reflectivity of the formed layer was as shown in FIG. 10, and the distribution of component was as shown in FIG. 11. In FIG. 10, the abscissa indicates the wave length λ in μm and the ordinate indicates the reflectivity R in %, and in FIG. 11, the abscissa indicates the depth H from the outer surface of the coating layer in Å and the ordinate indicates volume percentage of Cr measured with a surface analysis by Auger electron spectroscopy (AES). Moreover, the result of AES at each depth H was shown in FIG. 14 in which the ordinate indicates atomic percentages of Cr, O and Al.

We claim:

1. A method for forming an inhomogeneous optical layer on a surface of a substrate, in which, while the substrate is moved along a travelling path having a path section or a number of path sections, two different evaporation substances evaporated from their respective source means is deposited on said surface with the deposition rate of each of these substances being varied monotonously along the travelling path in the path section or each of the path sections.

2. A method according to claim 1 in which the incident angle and the flight length of each of the evaporation substances are varied monotonously along the travelling path in the path section or each of the path sections in order that the deposition rate of each of these substances is varied monotonously along the travelling path in the path section or each of the path sections.

* * * * *

UNITED STATES PATENT AND TRADEMARK OFFICE
CERTIFICATE OF CORRECTION

PATENT NO. : 4,428,980
DATED : January 31, 1984
INVENTOR(S) : Kuzuo Nakamura et al.

It is certified that error appears in the above-identified patent and that said Letters Patent is hereby corrected as shown below:

On the front page:

The designation of the assignee is changed to read:

[73] Assignee: Ulvac Seimaku Kabushiki Kaisha and Nihon Shinku Gijutsu Kabushiki Kaisha, both of Japan.

The designation of the related U.S. Application data is changed to read:

[62] Division of Ser. No. 373,145, April 29, 1982, Patent No. 4,416,217.

Signed and Sealed this

Fourteenth Day of May 1985

[SEAL]

Attest:

DONALD J. QUIGG

Attesting Officer     Acting Commissioner of Patents and Trademarks